US009373611B2

(12) United States Patent
Nishimura et al.

(10) Patent No.: US 9,373,611 B2
(45) Date of Patent: Jun. 21, 2016

(54) SEMICONDUCTOR INTEGRATED CIRCUIT DEVICE

(75) Inventors: Hidetoshi Nishimura, Osaka (JP);
Tomoaki Ikegami, Hyogo (JP)

(73) Assignee: SOCIONEXT INC., Kanagawa (JP)

( * ) Notice: Subject to any disclaimer, the term of this patent is extended or adjusted under 35 U.S.C. 154(b) by 490 days.

(21) Appl. No.: 13/427,188

(22) Filed: Mar. 22, 2012

(65) Prior Publication Data

US 2012/0256234 A1 Oct. 11, 2012

(30) Foreign Application Priority Data

Apr. 8, 2011 (JP) ................................. 2011-086454

(51) Int. Cl.
*H01L 23/52* (2006.01)
*H01L 27/02* (2006.01)
*H01L 27/118* (2006.01)
*H03K 3/356* (2006.01)

(52) U.S. Cl.
CPC ...... *H01L 27/0207* (2013.01); *H01L 27/11807* (2013.01); *H03K 3/356121* (2013.01); *H01L 2027/11875* (2013.01); *H01L 2027/11879* (2013.01); *H01L 2027/11881* (2013.01)

(58) Field of Classification Search
None
See application file for complete search history.

(56) References Cited

U.S. PATENT DOCUMENTS

| 6,483,131 | B1 | 11/2002 | Ko | |
|---|---|---|---|---|
| 7,875,909 | B2 | 1/2011 | Uchida | |
| 2003/0201472 | A1* | 10/2003 | Ho | H01L 23/5225 257/207 |
| 2003/0230769 | A1* | 12/2003 | Tsutsumi et al. | 257/207 |
| 2005/0156200 | A1* | 7/2005 | Kinoshita | 257/207 |
| 2007/0205451 | A1* | 9/2007 | Mizushino et al. | 257/300 |
| 2008/0127000 | A1* | 5/2008 | Majumder et al. | 716/2 |
| 2009/0039520 | A1* | 2/2009 | Tanaka et al. | 257/773 |
| 2010/0059794 | A1* | 3/2010 | Shimizu et al. | 257/206 |
| 2011/0006439 | A1* | 1/2011 | Ichiryu et al. | 257/774 |
| 2011/0049575 | A1* | 3/2011 | Tanaka | 257/206 |
| 2011/0073953 | A1* | 3/2011 | Nishimura et al. | 257/369 |
| 2011/0278592 | A1* | 11/2011 | Tsuboi et al. | 257/77 |

FOREIGN PATENT DOCUMENTS

| JP | 03-219658 | 9/1991 | |
|---|---|---|---|
| JP | 07-249746 | 9/1995 | |
| JP | 07-249747 | 9/1995 | |
| JP | 2008-283039 | 11/2008 | |
| JP | 2012227395 A | * 11/2012 | |
| WO | WO 2010122754 A1 | * 10/2010 | H01L 27/02 |

* cited by examiner

*Primary Examiner* — Hoang-Quan Ho
(74) *Attorney, Agent, or Firm* — McDermott Will & Emery LLP (57) ABSTRACT

First, second, and third power wirings and plurality of first signal wirings are formed on the upper layer of a semiconductor substrate, and at least one second signal wiring is formed on the upper layer of the plurality of first signal wirings. First and second power wirings are mutually separated in the cell height direction and extended in the cell width direction. Third power wiring extends between the first and second power wirings in the cell width direction. The plurality of first signal wirings are separated from first, second, and third power wirings, and electrically connected to at least one of the plurality of circuit elements. At least one second signal wiring extends in the cell width direction, and electrically connected to at least one of the plurality of circuit elements and the plurality of first signal wirings.

16 Claims, 13 Drawing Sheets

SEMICONDUCTOR INTEGRATED CIRCUIT DEVICE

BACKGROUND

1. Technical Field

The present invention relates to a semiconductor integrated circuit device, and, in particular, to a semiconductor integrated circuit device which is provided with a standard logic cell having a multi-height structure.

2. Background Art

As a method of forming a semiconductor integrated-circuit on a semiconductor substrate, a standard logic cell method has been known. The standard logic cell method is a method of designing a Large-Scale Integration (LSI) chip by providing a basic unit (for example, an inverter, a latch, a flip-flop, a full adder, or the like) having a specific logical function as a standard logic cell in advance, disposing a plurality of standard logic cells on a semiconductor substrate and connecting between the standard logic cells using metal wirings.

Figure 12:
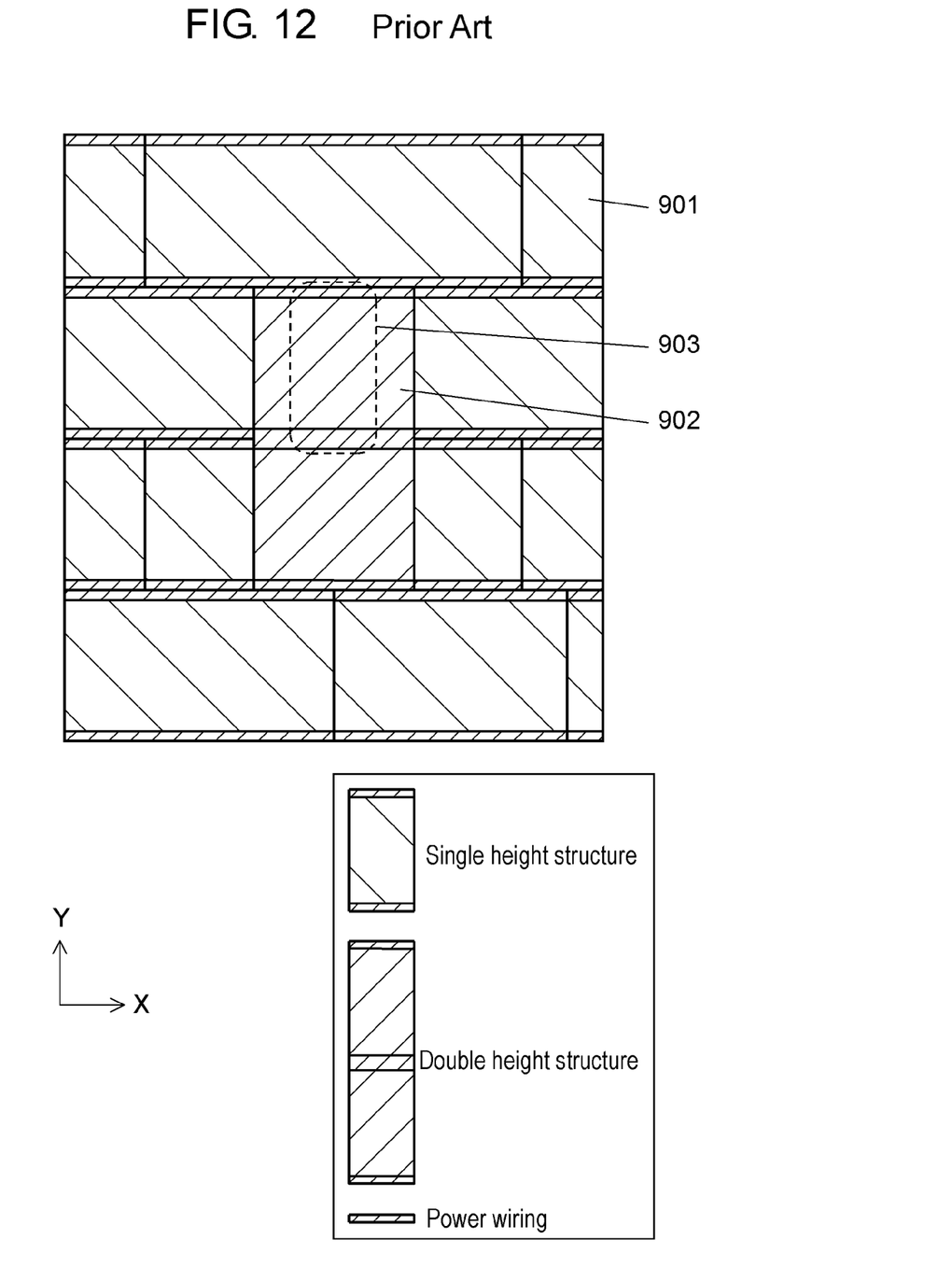
FIG. 12 is a schematic plan view illustrating a single height cell and a double height cell.

Recently, with accelerated demands for high-speed and small area in a semiconductor integrated-circuit, a method of applying a double height structure to a standard logic cell (for example, refer to Japanese Patent Unexamined Publication No. 7-249747) has been known as a method of enabling a transistor disposition region, which occupies the interior of a cell, to be effectively enlarged. FIG. 12 illustrates the schematic layout of a semiconductor integrated circuit device disclosed in Japanese Patent Unexamined Publication No. 7-249747. The semiconductor integrated circuit device includes standard logic cell 901 which has a single height structure (hereinafter, denoted by "single height cell"), and standard logic cell 902 which has a double height structure (hereinafter, denoted by "double height cell"). The cell height of single height cell 901 is uniform, and the cell width of single height cell 901 can be enlarged. Double height cell 902 has a cell height which is twice as high as the cell height of single height cell 901. Since double height cell 902 can enlarge the channel width of a transistor, which occupies the interior of a cell, by commoditizing a P-well region (or an N-well region), the drive capability of the transistor can be improved without enlarging the cell width, unlike single height cell 901.

Since a region where wiring is possible can be enlarged by changing the structure of the standard logic cell from a single height structure to the double height structure, the degree of the freedom of the disposition of contacts or wirings can be increased. As a result, M1 wiring which extends in the X-axis direction (cell width direction) can be disposed. A wiring path can be also circumvented using M2 wiring. M1 wiring is a wiring which is formed on a first metal wiring layer (that is, a metal wiring layer which is the nearest to a semiconductor substrate) disposed on the upper layer of the semiconductor substrate, and M2 wiring is a wiring which is formed on a second metal wiring layer (that is, a metal wiring layer which is the second nearest to the semiconductor substrate) disposed on the upper layer of the first metal wiring layer. M2 wiring extends in the Y-axis direction (cell height direction).

Figure 13:
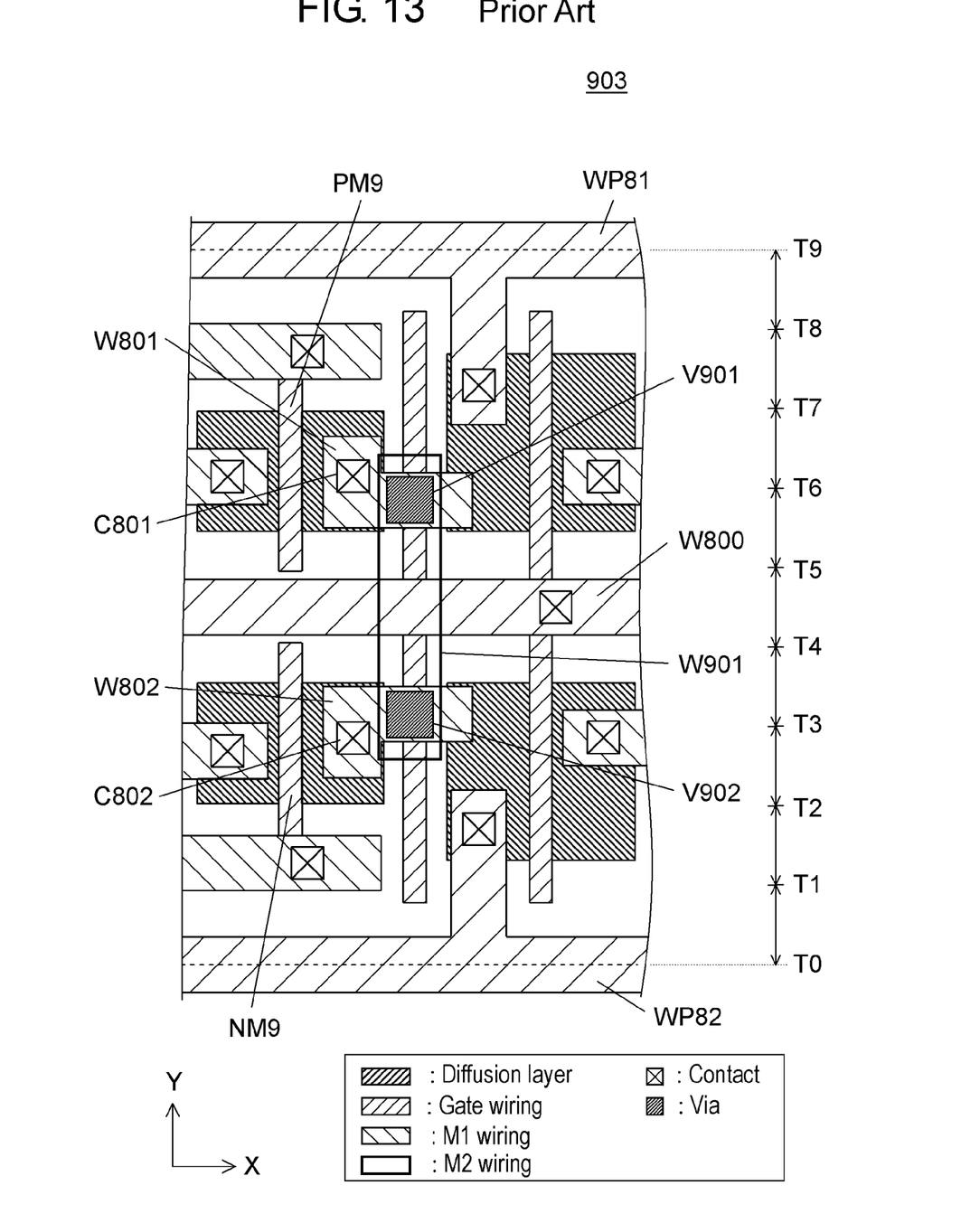
FIG. 13 is a plan view illustrating an example in which a wiring path is circumvented using M2 wiring which extends in the cell height direction in the double height cell.

The circumvention of the wiring path using M2 wiring, which extends in the Y-axis direction, will be described with reference to FIG. 13. FIG. 13 is an example of the layout of cell region 903 surrounded by the dotted-line of double height cell 902 shown in FIG. 12. Double height cell 902 includes three power wirings which extend in parallel with X-axis direction, and the cell height of double height cell 902 corresponds to 18 tracks. Cell region 903 corresponds to a part of the cell region between any one of power wiring WP81 of the power wirings of both ends and center power wiring WP82, and the separation distance between power wirings WP81 and WP82 corresponds to 9 tracks (that is, half of the cell height). Generally, the cell height of the standard logic cell is expressed using the number of wirings (that is, the number of wiring tracks) which can be added in the standard logic cell and which extend in the X-axis direction.

As shown in FIG. 13, when M1 wiring W800 which extends in the X-axis direction is disposed between PMOS transistor PM9 and NMOS transistor NM9, it is difficult to electrically connect each of the drain regions of PMOS transistor PM9 and NMOS transistor NM9 using M1 wiring. The drain region of PMOS transistor PM9 is electrically connected to M1 wiring W801 through contact C801, the drain region of NMOS transistor NM9 is electrically connected to M1 wiring W802 through contact C802, and each of M1 wirings W801 and W802 is electrically connected to M2 wiring W901 through vias V901 and V902.

In double height cell, M2 wiring which extends in the Y-axis direction is used in order to circumvent the wiring path. Not only in the double height cell but also in a standard logic cell which includes a multi-height structure, M2 wiring which extends in the Y-axis direction (cell height direction) is used in order to circumvent the wiring path. The standard logic cell which includes the multi-height structure is the standard logic cell which has a cell height n times (n is an integer number which is equal to or greater than 2) higher than the cell height of a single height cell.

SUMMARY

However, since a region where wiring is possible is narrowed by reducing the cell height of the standard logic cell, the degree of freedom of wiring of M1 wiring is lowered. Therefore, there is a case where it is difficult to dispose M1 wiring which extends in the cell width direction (that is, a case where it is difficult to extend M1 wiring in the cell width direction). Even when M2 wiring which extends in the cell height direction is used, it may be difficult to circumvent a wiring path, so that it may be difficult to electrically connect between circuit elements (that is, it is difficult to configure a circuit which has a desired logic function). Therefore, it is difficult to reduce the cell height of the standard logic cell. It is also difficult to reduce the cell height of a standard logic cell which has a multi-height structure as well as the double height structure.

The present invention enables the cell height of a standard logic cell to be reduced while the electrical connection relationship between the circuit elements of the standard logic cell is maintained in a semiconductor integrated circuit device which is provided with the standard logic cell having a multi-height structure.

According to a first aspect of the invention, a semiconductor integrated circuit device is a semiconductor integrated circuit device which includes a standard logic cell. The standard logic cell includes a plurality of circuit elements which are formed on a semiconductor substrate, and first and second power wirings which are respectively formed on the upper layer of the semiconductor substrate, which are separated from each other in the cell height direction in a planar view and extend in the cell width direction which is perpendicular to the cell height direction, and which supply a first reference voltage. The standard logic cell further includes a third power wiring which is formed on the upper layer of the semiconductor substrate, which extends in the cell width direction between the first and second power wirings in the planar view, and which supplies a second reference voltage which is different from the first reference voltage. The standard logic cell further includes a plurality of first signal wirings which are respectively formed on the upper layer of the semiconductor substrate, which are separated from the first, second, and third power wirings in the planar view, and which are electrically connected to at least one of the plurality of circuit elements, and includes at least one second signal wiring which is formed on the upper layer of the plurality of first signal wirings, which extends in the cell width direction in the planar view, and which is electrically connected to at least one of the plurality of circuit elements and the plurality of first signal wirings. In the semiconductor integrated circuit device, even when it is difficult to dispose the first signal wirings which extend in the cell width direction, a wiring path can be circumvented using the second signal wiring which extends in the cell width direction, so that the cell height of the standard logic cell can be reduced while the electrical connection relationship between the circuit elements is maintained.

A plurality of second signal wirings may be included in the standard logic cell, and the standard logic cell may further include a first auxiliary wiring which is formed on the same layer with the plurality of second signal wirings, which extends in the cell height direction in the planar view, and which connects two second signal wirings from among the plurality of second signal wirings. With this configuration, even when it is difficult to dispose the first signal wirings which extend in the cell width direction and the first signal wiring which extends in the cell height direction, the wiring path can be circumvented using the first auxiliary wiring and a bent wiring which includes two second signal wirings, so that the cell height of the standard logic cell can be reduced while the electrical connection relationship between the circuit elements is maintained.

The first auxiliary wiring may extend in the cell height direction across the third power wiring in the planar view, and may connect the second signal wiring, which is disposed between the first and third power wirings, with the second signal wiring, which is disposed between the second and third power wirings, from among the plurality of second signal wirings. With this configuration, the circuit elements can be electrically connected across the third power wiring. Therefore, a wiring (for example, a gate wiring) may not be additionally formed in order to circumvent the third power wiring, so that the cell area of the standard logic cell can be prevented from increasing.

The first auxiliary wiring may extend in the cell height direction across the third power wiring in the planar view, and may connect two adjacent second signal wirings, which interpose the third power wiring therebetween, from among the plurality of second signal wirings. With this configuration, the deterioration of the degree of freedom of disposition of another second signal wiring can be suppressed.

The standard logic cell may further include a second auxiliary wiring which is integrally formed with a single second signal wiring from among the plurality of second signal wirings on the same layer with the plurality of second signal wirings, which extends in the cell height direction in the planar view, and which electrically connects the corresponding second signal wiring to at least one of the plurality of circuit elements and the plurality of first signal wirings. With this configuration, even when it is difficult to dispose the first signal wiring which extends in the cell width direction and the first signal wiring which extends in the cell height direction, the wiring path can be circumvented using the second auxiliary wiring and a bent wiring having the second signal wiring, so that the cell height of the standard logic cell can be reduced while the electrical connection relationship between the circuit elements is maintained.

A single second signal wiring may be included in the standard logic cell, and the standard logic cell may further include an auxiliary wiring which is integrally formed with the second signal wiring on the same layer with the second signal wiring, which extends in the cell height direction in the planar view, and which electrically connects the second signal wiring to at least one of the plurality of circuit elements and the plurality of first signal wirings.

As described above, the cell height of the standard logic cell can be reduced while the electrical connection relationship between the circuit elements of the standard logic cell is maintained.

DESCRIPTION OF EMBODIMENTS

Embodiments will be described in detail with reference to the accompanying drawings. The same reference numerals are used to indicate the same or equivalent parts throughout the drawings, and the description thereof will not be repeated.

First Exemplary Embodiment

Figure 1:
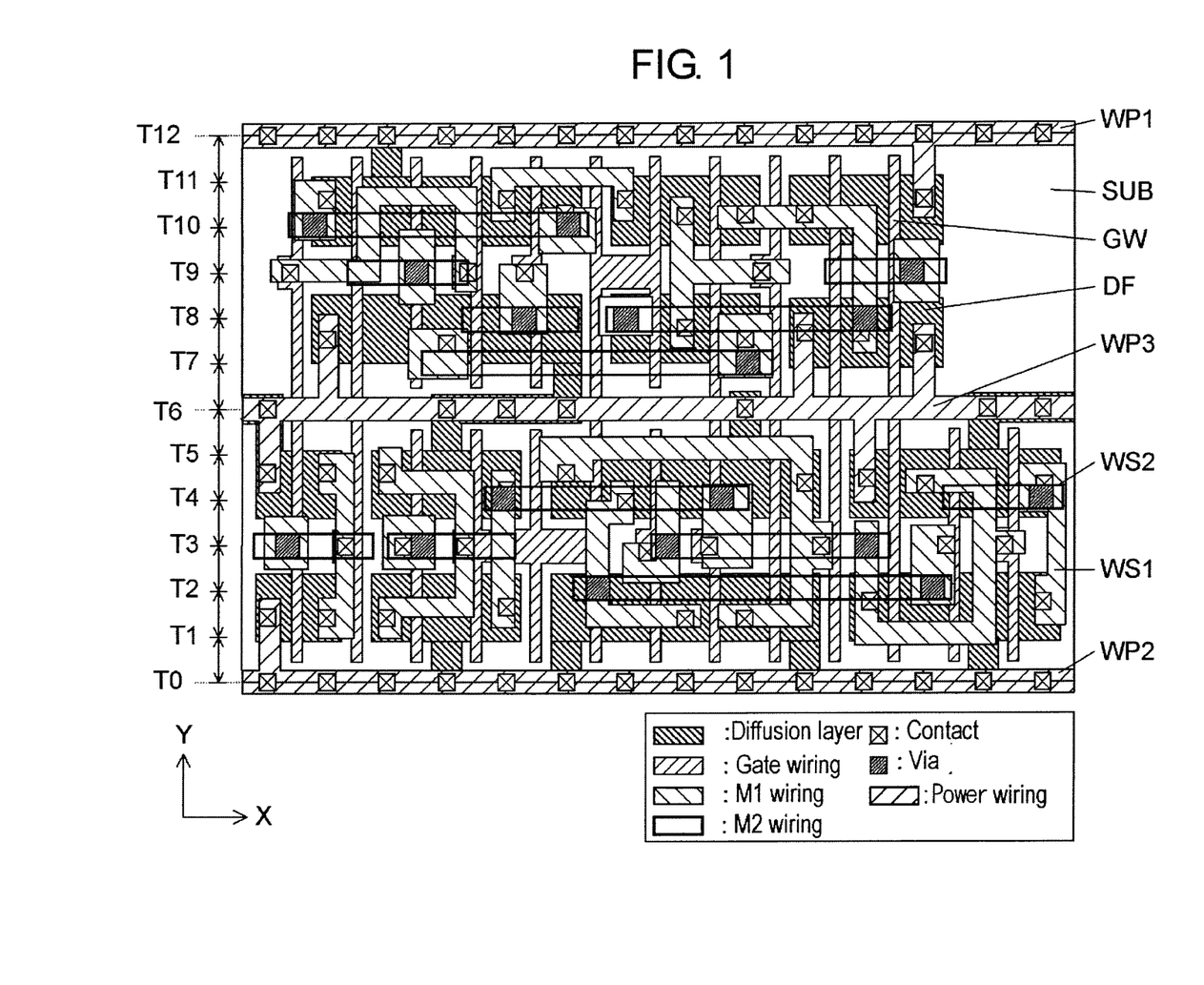
FIG. 1 is a plan view illustrating an example of the layout of a standard logic cell which is provided in a semiconductor integrated circuit device according to a first embodiment.
Figure 2:
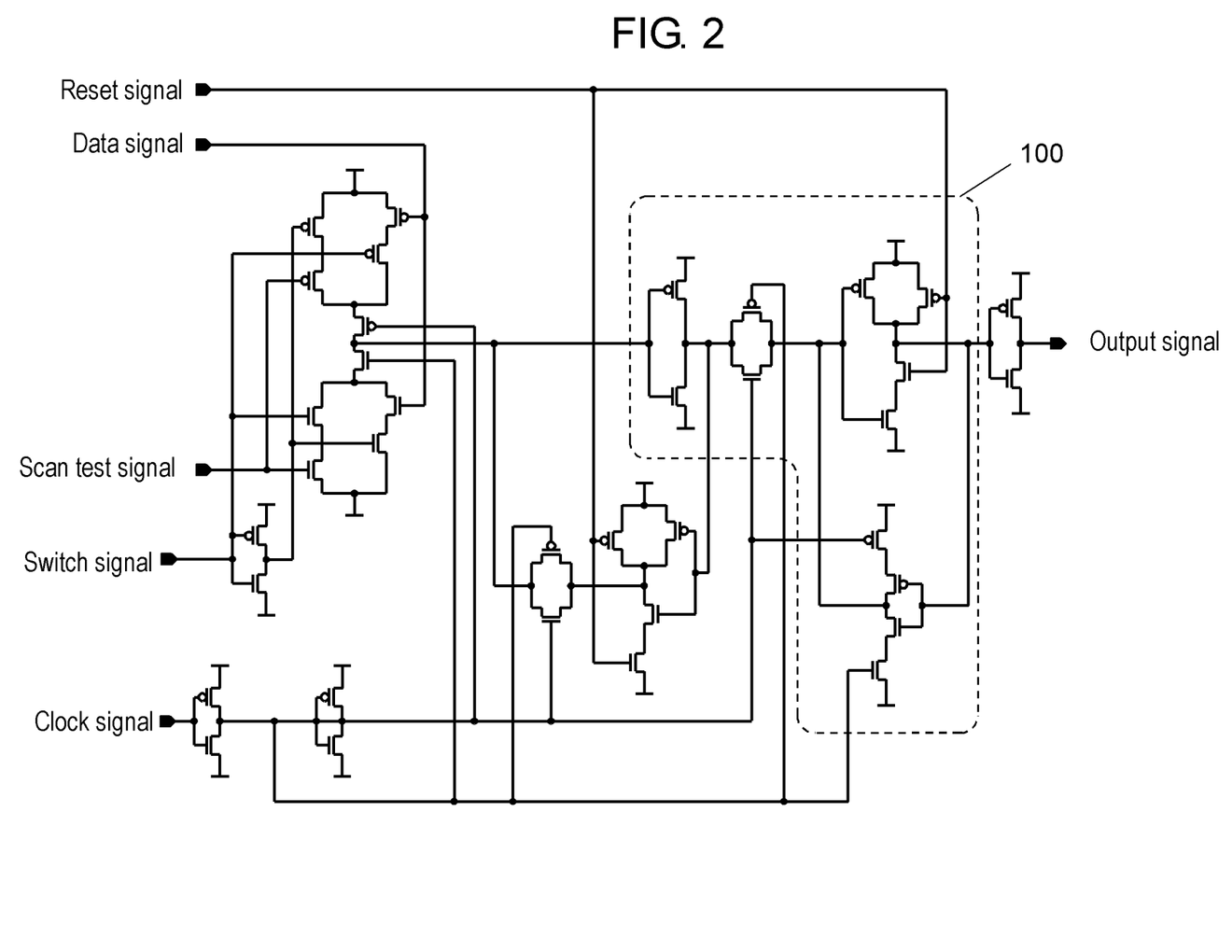
FIG. 2 is a circuit diagram illustrating the circuit configuration of the standard logic cell shown in FIG. 1.

FIG. 1 illustrates an example of the layout of a standard logic cell which is provided in a semiconductor integrated circuit device according to a first embodiment. The standard logic cell includes a flip-flop as shown in FIG. 2. The standard logic cell includes a plurality of circuit elements (here, diffusion layer DF and gate wiring GW which are the components of a MOS transistor), power wirings WP1, WP2, and WP3 (first, second, and third power wirings), a plurality of first signal wirings WS1, and a plurality of second signal wirings WS2.

The plurality of circuit elements are formed on semiconductor substrate SUB. Power wirings WP1, WP2, and WP3 and the plurality of first signal wirings WS1 are formed on the upper layer of semiconductor substrate SUB. The plurality of second signal wirings WS2 are formed on the upper layers of the plurality of first signal wirings WS1. For example, power wirings WP1, WP2, and WP3 and the plurality of first signal wirings WS1 are formed on the first wiring layer (for example, a first metal wiring layer which is the nearest to semiconductor substrate SUB) which is disposed on the upper layer of semiconductor substrate SUB, and the plurality of second signal wirings WS2 are formed on the second wiring layer (for example, a second metal wiring layer which is the second nearest to semiconductor substrate SUB) which is disposed on the upper layer of the first wiring layer. Here, power wirings WP1, WP2, and WP3 and the plurality of first signal wirings WS1 are configured by M1 wiring (wiring formed on the first metal wiring layer), and the plurality of second signal wiring WS2 are configured by M2 wiring (wiring formed on the second metal wiring layer). Only a circumferential line is illustrated to indicate M2 wiring in the drawing.

In planar view, power wirings WP1 and WP2 are separated from each other in the Y-axis direction and are extended in the X-axis direction (direction which is perpendicular to the Y-axis direction). Here, the planar view corresponds to a case where the standard logic cell is viewed from the normal line direction of the principal surface of semiconductor substrate SUB, the X-axis direction corresponds to the cell width direction of the standard logic cell, and the Y-axis direction corresponds to the cell height direction of the standard logic cell. Power wiring WP3 extends in the X-axis direction between power wirings WP1 and WP2. In planar view, each of the plurality of first signal wirings WS1 is separated from the first, second, and third power wirings and each of the plurality of second signal wirings WS2 extends in the X-axis direction. Here, first signal wiring WS1 corresponds to M1 wiring excluding power wirings WP1, WP2, and WP3 from among the plurality of M1 wirings which are formed on the first metal wiring layer in the standard logic cell, second signal wiring WS2 corresponds to M2 wirings which are formed on the second metal wiring layer in the standard logic cell.

Power wirings WP1 and WP2 supply power voltage (first reference voltage), and power wiring WP3 supplies ground voltage (second reference voltage). Each of the plurality of first signal wirings WS1 is electrically connected to at least one of the plurality of circuit elements (diffusion layer DF and gate wiring GW) via a contact, and each of the plurality of second signal wirings WS2 is electrically connected to at least one of the plurality of circuit elements and the plurality of first signal wirings WS1 through a via.

Here, the contact is a connection region where diffusion layer DF (or gate wiring GW) electrically connects to M1 wiring, and the via is a connection region where M1 wiring electrically connects to M2 wiring.

The cell height of the standard logic cell shown in FIG. 1 corresponds to 12 tracks. 1 track is a unit which is determined based on a minimum wiring width and a minimum wiring interval, and corresponds to the interproximal interval of the center line of a wiring track. The wiring track corresponds to the reference line, such as a grid line, of the wiring disposition, and the center line of the plurality of wiring tracks performs division in the Y-axis direction at equal intervals and extends in the X-axis direction. Here, power wirings WP1, WP2, and WP3 are formed to overlap with 0-th wiring track T0, sixth wiring track T6, twelfth wiring track T12, respectively, in planar view. The separation distance between power wirings WP1 and WP3 corresponds to 6 tracks, and the separation distance between power wirings WP2 and WP3 corresponds to 6 tracks. The separation distance between power wirings WP1 and WP3 is equal to the separation distance between power wirings WP2 and WP3. Each of the plurality of second signal wirings WS2 is disposed to overlap with any one wiring track of wiring tracks T0 to T12 in the planar view. That is, each of the plurality of second signal wirings WS2 is formed to be separated at a regular interval in the Y-axis direction in the planar view.

(Part of Circuit Configuration of Standard Logic Cell)

Figure 3:
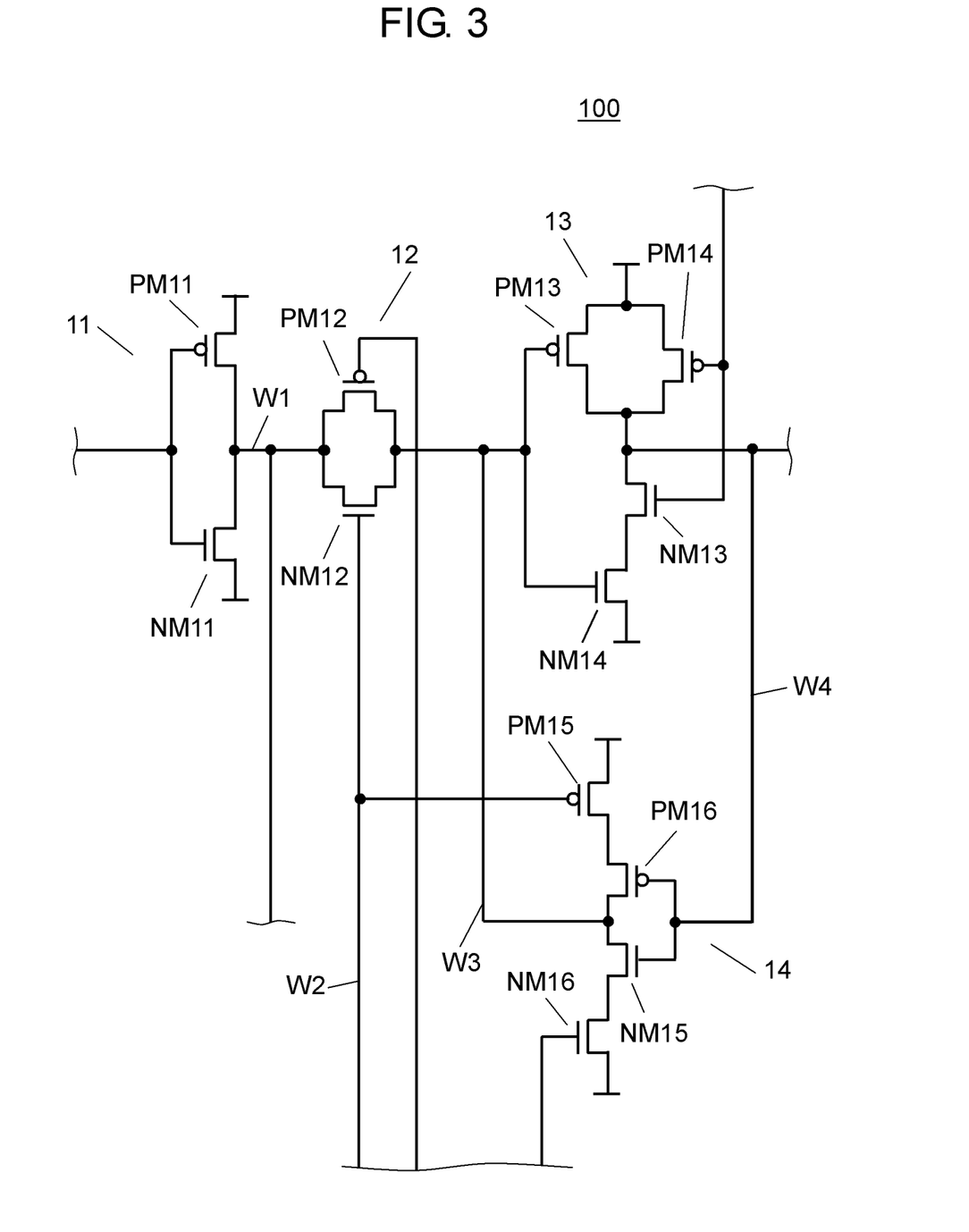
FIG. 3 is a circuit diagram illustrating a part of the circuit configuration of the standard logic cell shown in FIG. 2.

FIG. 3 illustrates circuit region 100, which is surrounded by a dotted-line, of the circuit configuration of the standard logic cell shown in FIG. 2. Circuit region 100 includes inverter 11, transfer gate 12, two-input NAND circuit 13, and tri-state inverter 14. Two input NAND circuits 13 and tri-state inverter 14 are included in a slave latch. Inverter 11 includes PMOS transistor PM11 and NMOS transistor NM11, transfer gate 12 includes PMOS transistor PM12 and NMOS transistor NM12. Two input NAND circuits 13 includes PMOS transistors PM13 and PM14 and NMOS transistors NM13 and NM14, and tri-state inverter 14 includes PMOS transistors PM15 and PM16 and NMOS transistors NM15 and NM16. Connection wiring W1 electrically connects the output of inverter 11 (the drains of PMOS transistor PM11 and NMOS transistor NM11) to the input of transfer gate 12 (the sources of PMOS transistor PM12 and NMOS transistor NM12). Connection wiring W2 electrically connects to transfer gate 12 (the gate of NMOS transistor NM12) and to tri-state inverter 14 (the gate of PMOS transistor PM15). Connection wiring W3 electrically connects the output of transfer gate 12 (the drains of PMOS transistor PM12 and NMOS transistor NM12), the input of two-input NAND circuit (the gates of PMOS transistor PM13 and NMOS transistor NM14), and the output of tri-state inverter 14 (the drains of PMOS transistor PM16 and NMOS transistor NM15). Connection wiring W4 electrically connects the output of two-input NAND circuit (the drains of PMOS transistors PM13 and PM14 and NMOS transistor NM13) to the input of tri-state inverter 14 (the gates of PMOS transistor PM16 and NMOS transistor NM15).

(Part of Example of Layout of Standard Logic Cell)

Figure 4:
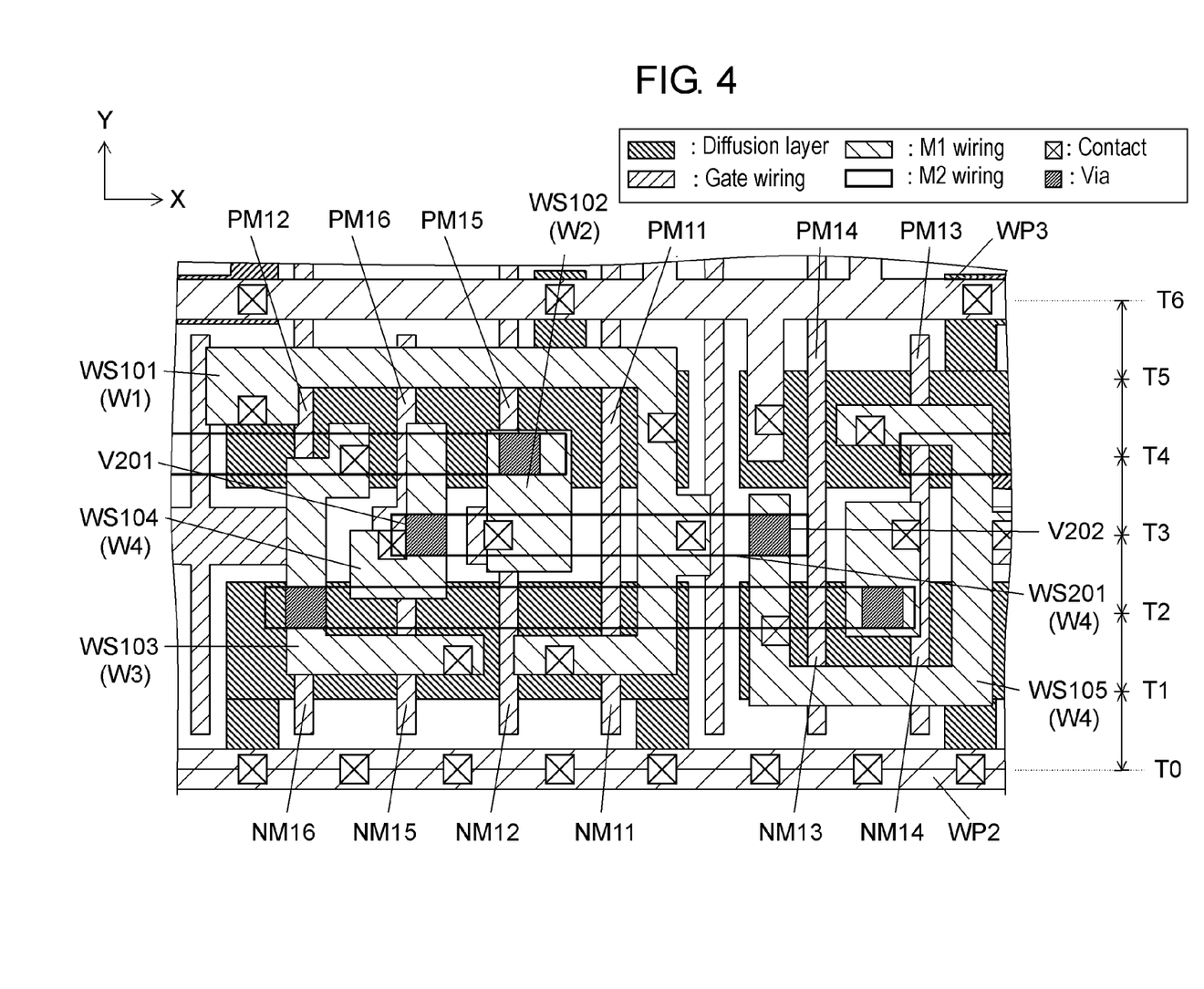
FIG. 4 is a plan view illustrating a part of the example of the layout of the standard logic cell corresponding to a part of the circuit configuration of the standard logic cell shown in FIG. 3.

FIG. 4 illustrates a part of an example of the layout of the standard logic cell corresponding to the part (circuit region 100) of the circuit configuration of the standard logic cell shown in FIG. 3. First signal wirings WS101, WS102, and WS103 correspond to connection wirings W1, W2, and W3 shown in FIG. 3, respectively, and the combination of first signal wirings WS104 and WS105 and second signal wiring WS201 corresponds to connection wiring W4 shown in FIG. 3.

The gates of PMOS transistor PM16 and NMOS transistor NM15 (the input of tri-state inverter 14) are electrically connected to first signal wiring WS104 through a contact, and the drains of PMOS transistor PM13 and PM14 and NMOS transistor NM13 (the output of two-input NAND circuit 13) are electrically connected to first signal wiring WS105 through a contact. In this case, since first signal wiring WS104 is surrounded by three first signal wirings WS101, WS102, and WS103, it is difficult to extend first signal wiring WS104 in the X-axis direction (cell width direction). Since power wiring WP3 is proximally disposed to the circumference of first signal wiring WS101, an area, in which new first signal wiring (M1 wiring) can be formed, is not secured between first signal wiring WS101 and power wiring WP3. Since power wiring WP2 is proximally disposed to the circumference of first signal wiring WS103, an area, in which new first signal wiring (M1 wiring) can be formed, is not secured between first signal wiring WS103 and power wiring WP2. Thus, it is difficult to dispose new M1 wiring which connects first signal wirings WS104 and WS105. When first signal wirings WS104 and WS105 are electrically connected to second signal wiring WS201 (M2 wiring) through vias V201 and V202, respectively, first signal wirings WS104 and WS105 can be circumvented with second signal wiring WS201 which extends in the X-axis direction.

As described above, even when it is difficult to dispose first signal wiring (M1 wiring) which extends in the X-axis direction, a wiring path can be circumvented with second signal wiring (M2 wiring) which extends in the X-axis direction, so that the cell height of the standard logic cell can be reduced while the electrical connection relationship between circuit elements is maintained. Thus, the cell area of the standard logic cell can be reduced.

Second Exemplary Embodiment

Figure 5:
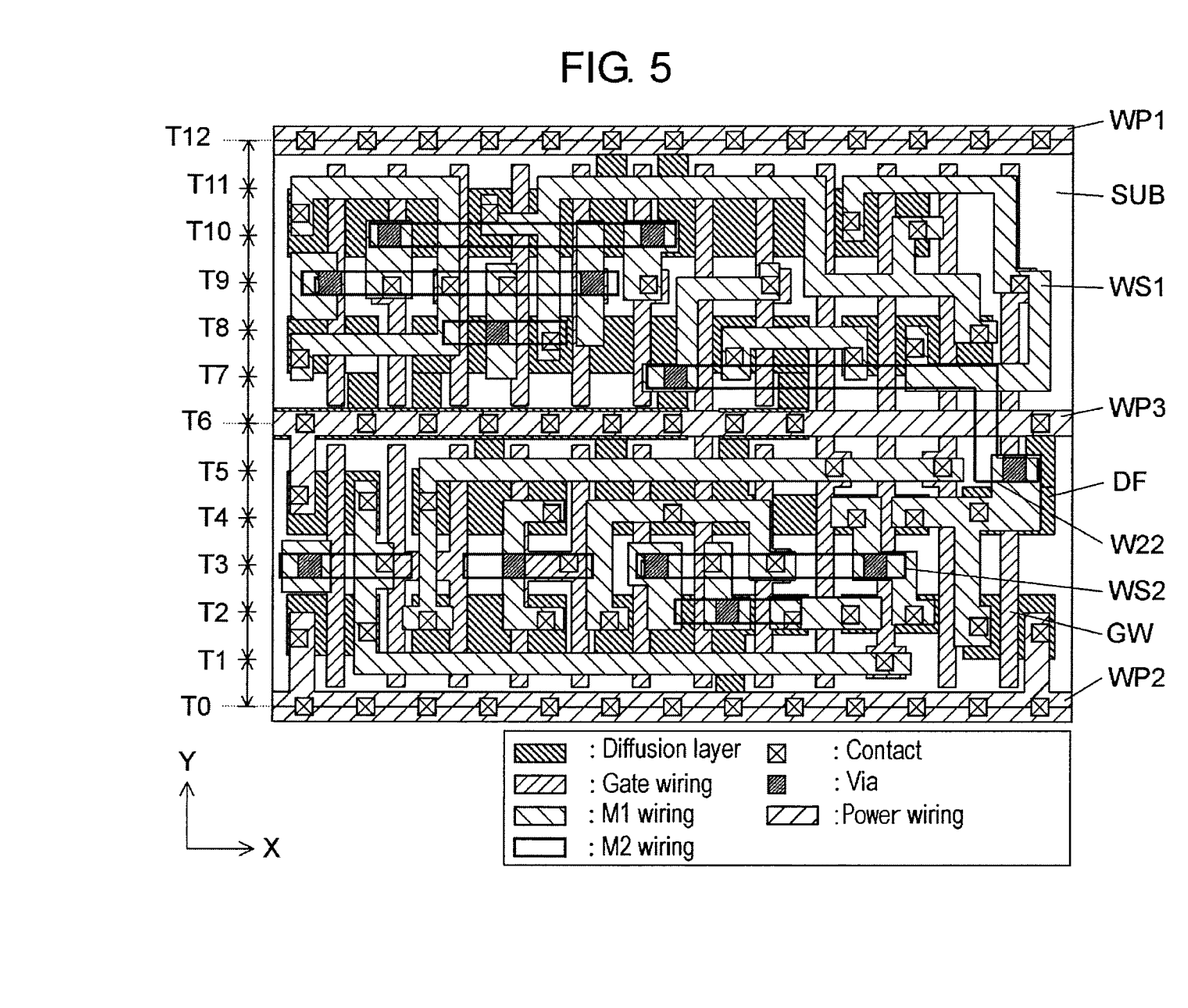
FIG. 5 is a plan view illustrating an example of the layout of a standard logic cell which is provided in a semiconductor integrated circuit device according to a second embodiment.
Figure 6:
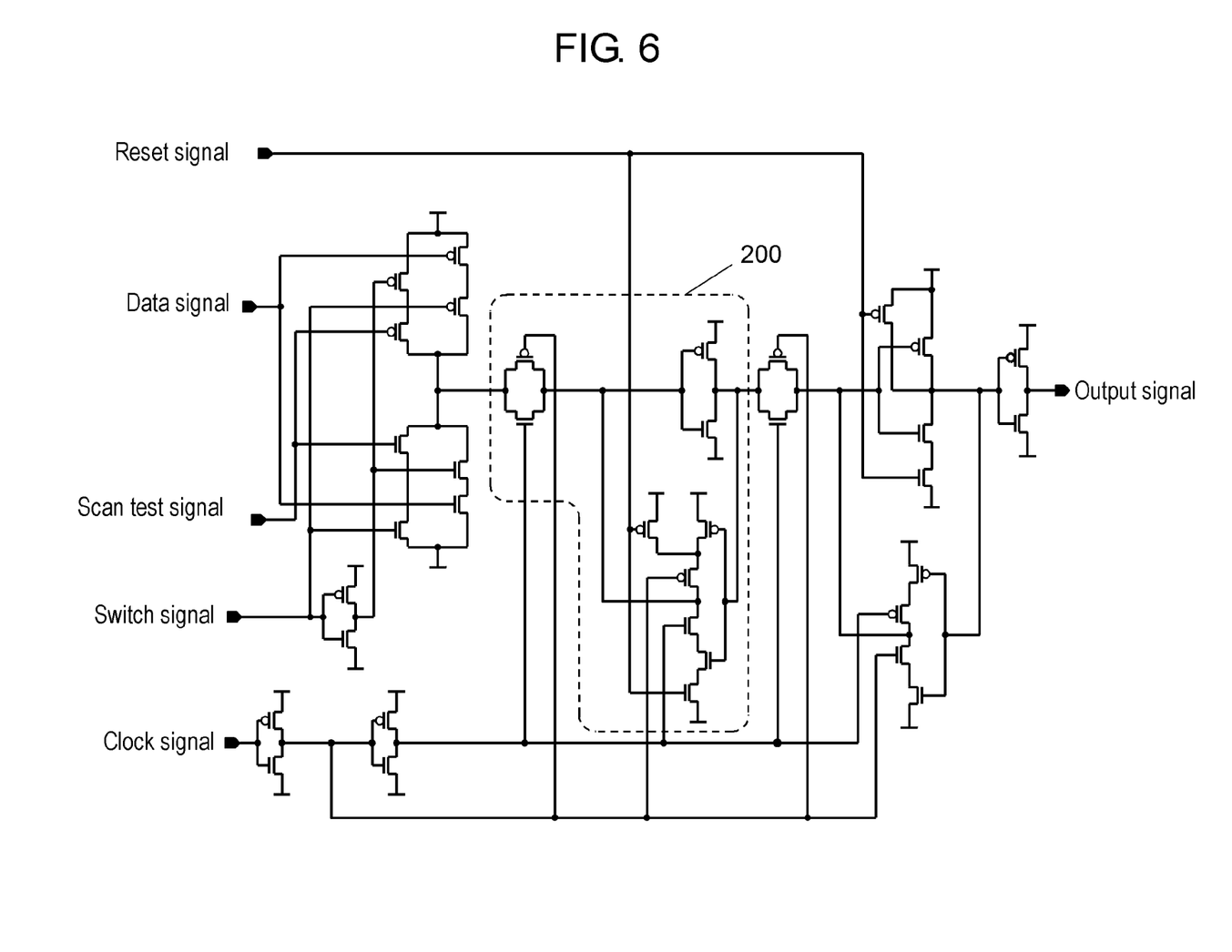
FIG. 6 is a view illustrating the circuit configuration of the standard logic cell shown in FIG. 5.

FIG. 5 illustrates an example of the layout of a standard logic cell which is provided in a semiconductor integrated circuit device according to a second embodiment. The standard logic cell includes a flip-flop as shown in FIG. 6. The standard logic cell includes bent wiring W22 in addition to the configuration of the standard logic cell shown in FIG. 1. Bent wiring W22 is formed on the same layer on which the plurality of second signal wirings WS2 are formed. Here, bent wiring W22 is formed on a second metal wiring layer. Bent wiring W22 will be described later.

Part of Circuit Configuration of Standard Logic Cell

Figure 7:
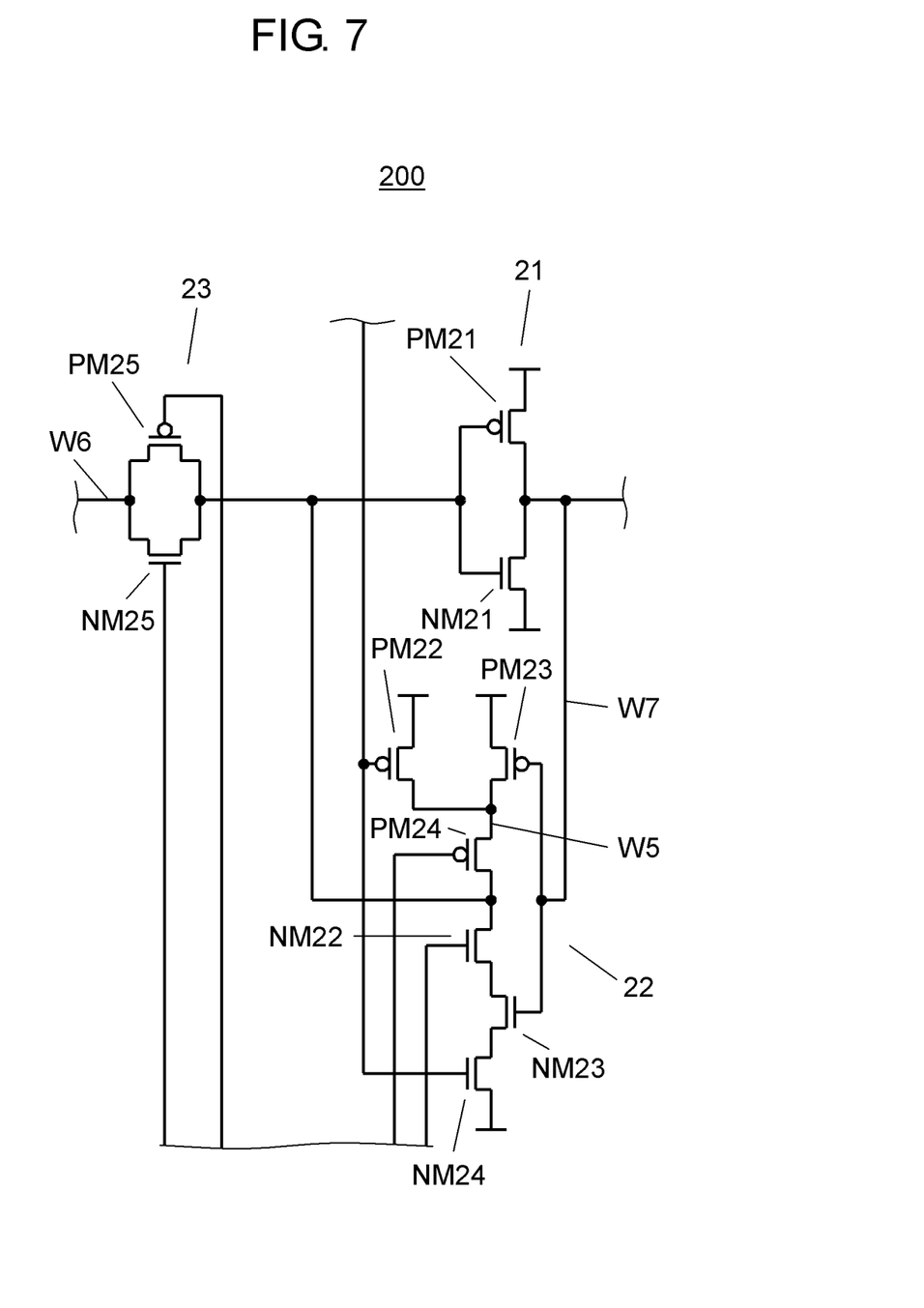
FIG. 7 is a circuit diagram illustrating a part of the circuit configuration of the standard logic cell shown in FIG. 6.

FIG. 7 illustrates circuit region 200, which is surrounded by the dotted line, of the circuit configuration of the standard logic cell shown in FIG. 6. Circuit region 200 includes inverter 21, two-input NAND circuit 22, and transfer gate 23. Inverter 21 and two-input NAND circuit 22 are included in a master latch. Inverter 21 includes PMOS transistor PM21 and NMOS transistor NM21. Two-input NAND circuit 22 includes PMOS transistors PM22, PM23, and PM24 and NMOS transistors NM22, NM23, and NM24. Transfer gate 23 includes PMOS transistor PM25 and NMOS transistor NM25. Connection wiring W5 electrically connects the drains of PMOS transistors PM22 and PM23, which are included in two-input NAND circuit 22, with the source of PMOS transistor PM24. Connection wiring W6 is electrically connected to the input of transfer gate 23 (the sources of PMOS transistor PM25 and NMOS transistor NM25). Connection wiring W7 electrically connects the output of inverter 21 (the drains of PMOS transistor PM21 and NMOS transistor NM21) to the input of two-input NAND circuit 22 (the gates of PMOS transistor PM23 and NMOS transistor NM23).

(Part of Example of Layout of Standard Logic Cell)

Figure 8:
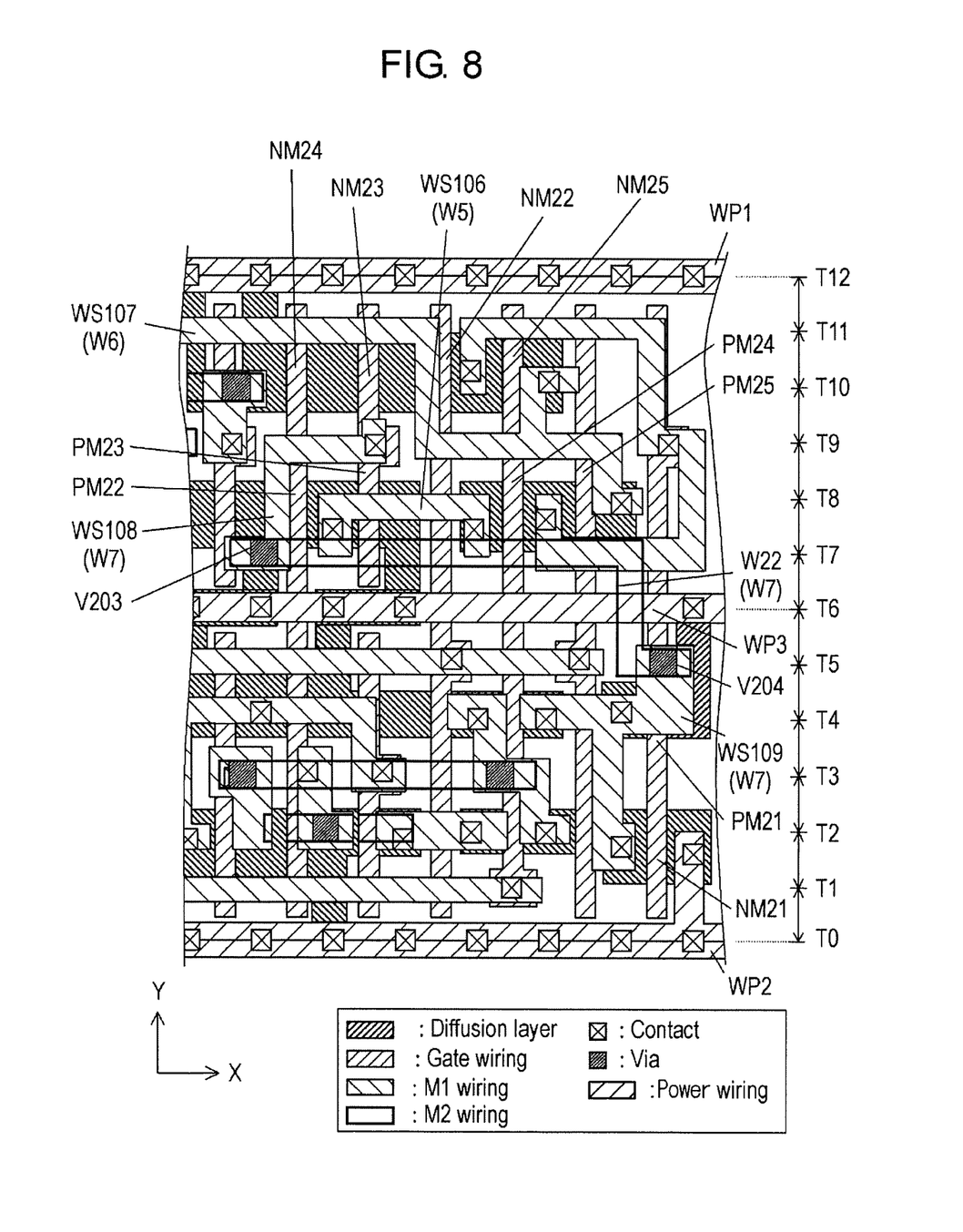
FIG. 8 is a plan view illustrating a part of an example of the layout of the standard logic cell corresponding to a part of the circuit configuration of the standard logic cell shown in FIG. 7.

FIG. 8 illustrates a part of an example of the layout of the standard logic cell which corresponds to the part (circuit region 200) of the circuit configuration of the standard logic cell shown in FIG. 7. First signal wirings WS106 and WS107 correspond to respective connection wirings W5 and W6 shown in FIG. 7. The combination of first signal wirings WS108 and WS109 and bent wiring W22 corresponds to connection wiring W7 shown in FIG. 7.

The drains of PMOS transistor PM21 and NMOS transistor NM21 (the output of inverter 21) are electrically connected to first signal wiring WS109 through a contact, and the gates of PMOS transistor PM23 and NMOS transistor NM23 (the input of two-input NAND circuit 22) are electrically connected to first signal wiring WS108 through a contact. In this case, since first signal wiring WS108 is surrounded by power wiring WP3 and two first signal wirings WS106 and WS107, it is difficult to dispose new first signal wiring (M1 wiring) which connects first signal wirings WS108 and WS109. When each of first signal wirings WS108 and WS109 is electrically connected to bent wiring W22 (M2 wiring) through via V203 or V204, first signal wirings WS108 and WS109 can be circumvented using connection wiring WS22.

(Bent Wiring)

Figure 9:
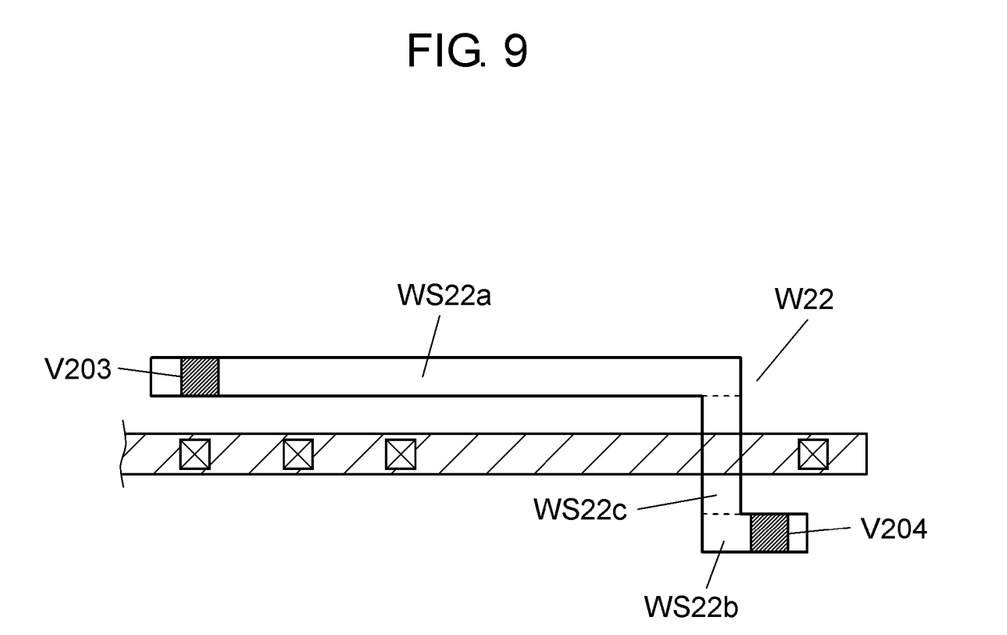
FIG. 9 is a plan view illustrating a bent wiring shown in FIG. 8.

Bent wiring W22, which is shown in FIGS. 5 and 8, will be described in detail with reference to FIG. 9. Bent wiring W22 includes second signal wirings WS22a and WS22b and auxiliary wiring WS22c. Auxiliary wiring WS22c is formed on the same layer on which second signal wirings WS22a and WS22b are formed. In planar view, second signal wirings WS22a and WS22b extend in the X-axis direction (cell width direction), and auxiliary wiring WS22c extends in the Y-axis direction (cell height direction). Auxiliary wiring WS22c connects second signal wirings WS22a and WS22b. Here, auxiliary wiring WS22c is formed on the second metal wiring layer. Second signal wiring WS22a is disposed between power wirings WP1 and WP3, second signal wiring WS22b is disposed between power wirings WP2 and WP3, and auxiliary wiring WS22c extends in the Y-axis direction across power wiring WP3 in planar view in order to connect second signal wirings WS22a and WS22b. Here, second signal wirings WS22a and WS22b are adjacent to each other while power wiring WP3 is interposed therebetween in planar view.

As described above, even when it is difficult to dispose the first signal wiring (M1 wiring) which extends in the X-axis direction and the first signal wiring (M1 wiring) which extends in the Y-axis direction, a wiring path can be circumvented using bent wiring (M2 wiring), so that the cell height of the standard logic cell can be reduced while the electrical relationship between circuit elements are maintained. Therefore, the cell area of the standard logic cell can be reduced.

When the circuit elements, which are formed in the cell area between power wirings WP1 and WP3, are electrically connected to the circuit elements which are formed in the cell region between power wirings WP2 and WP3 (that is, when circuit elements are electrically connected across power wiring WP3), a method of using gate wiring GW (poly-silicon wiring) which extends in the Y-axis direction across power wiring WP3 may be considered. However, since such a gate wiring GW is additionally formed, the cell area of the standard logic cell increases. On the other hand, in the standard logic cell shown in FIG. 5, auxiliary wiring WS22c which is included in bent wiring W22 extends in the Y-axis direction across power wiring WP3, so that the circuit elements can be electrically connected across power wiring WP3. Therefore, since gate wiring GW may not be additionally formed, the cell area of the standard logic cell can be prevented from increasing. Auxiliary wiring WS22c may not be across power wiring WP3 in planar view.

Since second signal wirings WS22a and WS22b, which are included in bent wiring W22, are adjacent to each other while power wiring WP3 is interposed therebetween, the deterioration of the degree of freedom of disposition of another second signal wiring (M2 wiring) can be suppressed. It is preferable that the separation distance between second signal wirings WS22a and WS22b, which are included in bent wiring W22, be 2 tracks. With this configuration, the deterioration of the degree of freedom of disposition of another second signal wiring (M2 wiring) can be minimized. Second signal wirings WS22a and WS22b, which are included in bent wiring W22, may be adjacent to each other while power wiring WP3 is not interposed therebetween. It is preferable that the separation distance between second signal wirings WS22a and WS22b (the length of auxiliary wiring WS22c) be an interval which does not affect to the disposition of first signal wiring WS1 (M1 wiring).

Modification of Second Embodiment

Figure 10:
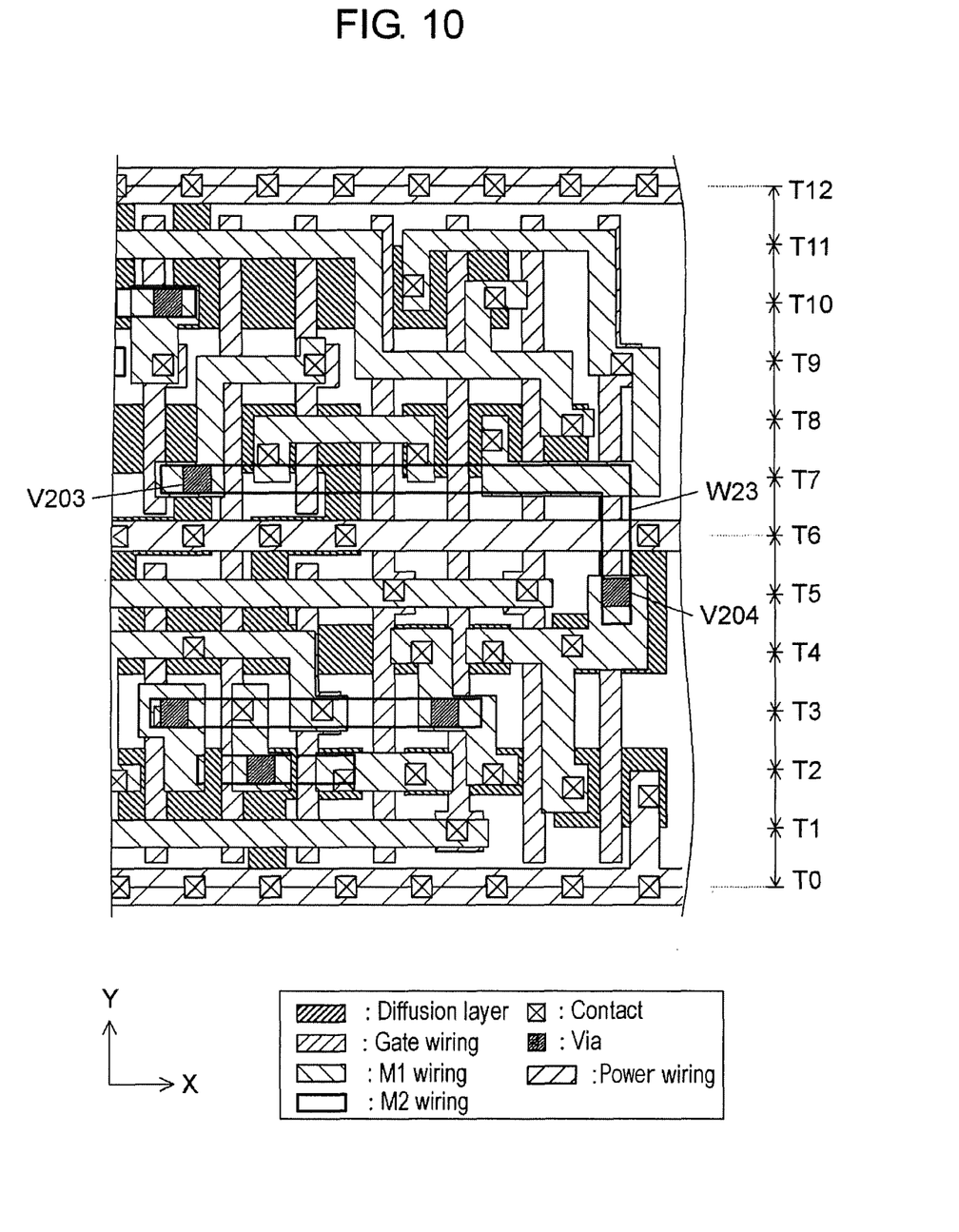
FIG. 10 is a view illustrating an example of another layout of the standard logic cell which is provided in the semiconductor integrated circuit device according to the second embodiment.

As shown in FIG. 10, the standard logic cell which is provided in the semiconductor integrated circuit device according to the second embodiment may include bent wiring W23 instead of bent wiring W22 shown in FIG. 5. Other configurations may be the same as those of the standard logic cell shown in FIG. 5.

Figure 11:
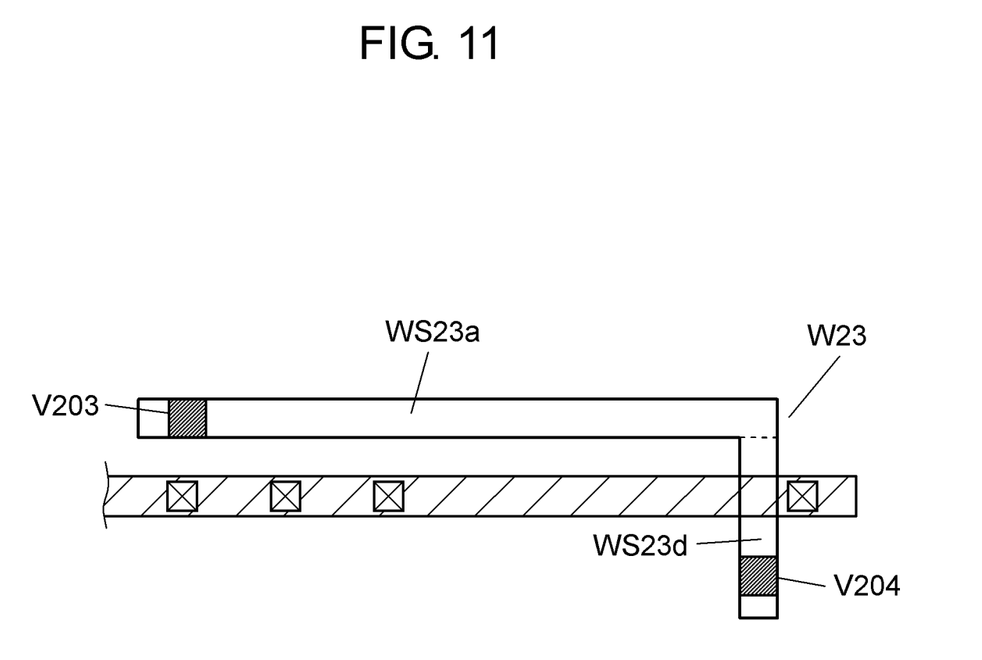
FIG. 11 is a plan view illustrating the bent wiring shown in FIG. 10.

As shown in FIG. 11, bent wiring W23 includes second signal wiring WS23a and auxiliary wiring WS23d. Auxiliary wiring WS23d is integrally formed with second signal wiring WS23a on the same layer of second signal wiring WS23a. In planar view, second signal wiring WS23a extends in the X-axis direction (cell width direction), and auxiliary wiring WS23d extends in the Y-axis direction (cell height direction). Here, auxiliary wiring WS23d electrically connect second signal wiring WS22a to at least one of the plurality of circuit elements (diffusion layer DF and gate wiring GW) and the plurality of first signal wirings WS1. Here, auxiliary wiring WS23d is formed on the second metal wiring layer. Auxiliary wiring WS23d extends in the Y-axis direction across power wiring WP3 in planar view. Second signal wiring WS23a is adjacent to power wiring WP3 in planar view.

Even in both the case where configuration is made as described above and the case where it is difficult to dispose the first signal wiring (M1 wiring) which extends in the X-axis direction and the first signal wiring (M1 wiring) which extends in the Y-axis direction, the wiring path can be circumvented using the bent wiring (M2 wiring), so that the cell height of the standard logic cell can be reduced while the electrical connection relationship between the circuit elements are maintained. Therefore, the cell area of the standard logic cell can be reduced.

Since auxiliary wiring WS23d, which is included in bent wiring W23, extends in the Y-axis direction across power wiring WP3, the circuit elements can be electrically connected across power wiring WP3. Therefore, since gate wiring GW may not be additionally formed, the cell area of the standard logic cell can be prevented from increasing. Auxiliary wiring WS23d may not be across power wiring WP3 in planar view.

Since second signal wiring WS23a, which is included in bent wiring W23, is adjacent to power wiring WP3, the deterioration of the degree of freedom of disposition of another second signal wiring (M2 wiring) can be suppressed. Second signal wiring WS23a, which is included in bent wiring W23, may not be adjacent to power wiring WP3. The length of auxiliary wiring WS23d may be an interval which does not affect to the disposition of first signal wiring WS1 (M1 wiring).

The standard logic cell, which is provided in the semiconductor integrated-circuit according to the second embodiment, may include both bent wiring W22 shown in FIG. 5 and bent wiring W23 shown in FIG. 10.

Other Embodiment

Although the case where the cell height of the standard logic cell corresponds to 12 tracks has been described as an example in the above-described embodiments for convenience of explanation, the cell height of the standard logic cell may be greater or less than 12 tracks. Although the standard logic cell which has the double height structure has been described as an example, the semiconductor integrated circuit device may be provided with a standard logic cell which has a multi-height structure. The standard logic cell which has the multi-height structure is a standard logic cell which has a cell height n times higher (n is integral number which is equal to or greater than 2) than the cell height of the single height cell. Although the case where a flip-flop is formed in the standard logic cell has been described as an example, the standard logic cell may include another circuit (for example, a latch, a full adder, or the like) other than the flip-flop.

Although description has been made such that power wirings WP1 and WP2 supply power voltage and power wiring WP3 supplies ground voltage, power wirings WP1 and WP2 may supply ground voltage and power wiring WP3 may supply power voltage. Although description has been made such that the separation distance between power wirings WP1 and WP3 is equal to the separation distance between power wirings WP2 and WP3, the separation distance between power wirings WP1 and WP3 may be different from the separation distance between power wirings WP2 and WP3. Although description has been made such that power wirings WP1, WP2, and WP3 are formed on the first metal wiring layer, power wirings WP1, WP2, and WP3 may be formed on another wiring layer (for example, the second metal wiring layer).

Although description has been made such that each of the plurality of second signal wirings WS2 is disposed to overlap with anyone of the wiring tracks in planar view (that is, each of the plurality of second signal wiring WS2 is formed to be separated at a regular interval in the Y-axis direction in planar view), each of the plurality of second signal wiring WS2 may not be separated at a regular interval in the Y-axis direction in planar view. A plurality of second signal wirings WS2 may be included in the standard logic cell, and a single second signal wiring WS2 may be included in the standard logic cell.

As described above, the above-described semiconductor integrated circuit device can reduce the cell height of the standard logic cell, so that the semiconductor integrated circuit device can be used as a semiconductor integrated circuit device which includes a standard logic cell, such as a flip-flop.

What is claimed is:

1. A semiconductor integrated circuit device which includes a standard logic cell, wherein the standard logic cell comprising:
 a plurality of circuit elements which are formed on a semiconductor substrate;
 first and second power wirings which are formed in a first wiring layer which is an upper layer of the semiconductor substrate, which are separated from each other in a cell height direction and extend in a cell width direction which is perpendicular to the cell height direction in a planar view, and which supply a first reference voltage to at least one of the plurality of circuit elements, wherein the first reference voltage is one of power voltage and ground voltage;
 a third power wiring which is formed in the first wiring layer, which extends in the cell width direction between the first and second power wirings in the planar view, and which supplies a second reference voltage which is different from the first reference voltage to at least one of the plurality of circuit elements, wherein the second reference voltage is the other of the power voltage and the ground voltage;

a plurality of first signal wirings formed in the first wiring layer, which are separated from the first, second, and third power wirings in the planar view, and each of which is electrically connected to at least one of the plurality of circuit elements; and a plurality of second signal wirings formed in a second wiring layer which is a next wiring layer just above the first wiring layer, each of which extends in the cell width direction in the planar view, and each of which is electrically connected to at least one of the plurality of circuit elements and the plurality of first signal wirings, wherein:

at least one of the plurality of second signal wirings extends in the cell width direction between the first and third power wirings in the planar view, has a linear shape having a longer length along the cell width direction than along the cell height direction, and is separated from other ones of the plurality of second signal wirings, the standard logic cell further includes a first auxiliary wiring which is formed in the second wiring layer, and the first auxiliary wiring extends in the cell height direction in the planar view, and connects two second signal wirings from among the plurality of second signal wirings.

2. The semiconductor integrated circuit device of claim 1, wherein the first auxiliary wiring extends in the cell height direction across the third power wiring in the planar view, and connects one of the plurality of second signal wirings disposed between the first and third power wirings with one of the plurality of second signal wirings disposed between the second and third power wirings.

3. The semiconductor integrated circuit device of claim 1, wherein the first auxiliary wiring extends in the cell height direction across the third power wiring in the planar view, and connects two adjacent one of the plurality of second signal wirings, which interpose the third power wiring therebetween.

4. The semiconductor integrated circuit device of claim 1, wherein the standard logic cell further includes a second auxiliary wiring which is integrally formed with a single second signal wiring from among the plurality of second signal wirings in the second wiring layer, the second auxiliary wiring extends in the cell height direction in the planar view, and electrically connects the corresponding single second signal wiring to at least one of the plurality of circuit elements and the plurality of first signal wirings.

5. The semiconductor integrated circuit device of claim 4, wherein the second auxiliary wiring extends in the cell height direction across the third power wiring in the planar view.

6. The semiconductor integrated circuit device of claim 4, wherein the corresponding single second wiring is adjacent to the third power wiring, and the second auxiliary wiring extends in the cell height direction across the third power wiring in the planar view.

7. The semiconductor integrated circuit device of claim 1, wherein the standard logic cell further includes an auxiliary wiring which is integrally formed with a single second signal wiring from among the plurality of second signal wirings in the second wiring layer, the auxiliary wiring extends in the cell height direction in the planar view, and electrically connects the corresponding single second signal wiring to at least one of the plurality of circuit elements and the plurality of first signal wirings.

8. The semiconductor integrated circuit device of claim 7, wherein the auxiliary wiring extends in the cell height direction across the third power wiring in the planar view.

9. The semiconductor integrated circuit device of claim 7, wherein the auxiliary wiring is integrally formed with a second signal wiring which is adjacent to the third power wiring from among the plurality of second signal wirings, and extends in the cell height direction across the third power wiring in the planar view.

10. The semiconductor integrated circuit device of claim 1, wherein the plurality of second signal wirings are formed to be separated at regular intervals in the cell height direction in the planar view.

11. The semiconductor integrated circuit device of claim 1, wherein the standard logic cell further includes an auxiliary wiring which is integrally formed with one of the plurality of second signal wirings in the second wiring layer, the auxiliary wiring extends in the cell height direction in the planar view, and electrically connects the corresponding one of the plurality of second signal wirings to at least one of the plurality of circuit elements and the plurality of first signal wirings.

12. The semiconductor integrated circuit device of claim 11, wherein the auxiliary wiring extends in the cell height direction across the third power wiring in the planar view.

13. The semiconductor integrated circuit device of claim 12, wherein one of the plurality of second signal wirings is adjacent to the third power wiring.

14. The semiconductor integrated circuit device of claim 1, wherein a separation distance between the first and third power wirings is equal to a separation distance of the second and third power wirings.

15. The semiconductor integrated circuit device of claim 1, wherein at least one of the plurality of second signal wirings extends in the cell width direction between the second and third power wirings in the planar view, is linear shaped, and is separated from other ones of the plurality of second signal wirings.

16. The semiconductor integrated circuit device of claim 1, further comprising at least one via connecting at least one of the plurality of first signal wirings and at least one of the plurality of second signal wirings, wherein the at least one via is formed in a via layer disposed between and adjacent to the first wiring layer and the second wiring layer.

* * * * *